United States Patent [19]

Kamiya

[11] Patent Number: 5,315,293

[45] Date of Patent: May 24, 1994

[54] OVERCURRENT DETECTING METHOD AND APPARATUS

[75] Inventor: Toshikazu Kamiya, Kariya, Japan

[73] Assignee: Kabushiki Kaisha Toyoda Jidoshokki Seisakusho, Kariya, Japan

[21] Appl. No.: 889,142

[22] Filed: May 27, 1992

[30] Foreign Application Priority Data

Jun. 11, 1991 [JP] Japan .................. 3-139222

[51] Int. Cl.$^5$ .............................................. G08B 21/00
[52] U.S. Cl. .................................... 340/664; 340/635; 361/94; 364/483
[58] Field of Search ......................... 340/664, 635, 644; 364/483; 361/94, 96, 97

[56] References Cited

FOREIGN PATENT DOCUMENTS 2020124 11/1979 United Kingdom .
2028034 2/1980 United Kingdom .
0253009 1/1988 United Kingdom .

Primary Examiner—Jeffrey A. Hofsass
Attorney, Agent, or Firm—Brooks Haidt Haffner & Delahunty

[57] ABSTRACT

In order to detect with high accuracy a current which may adversely affect an electric circuit if continued for an extended time, an apparatus periodically samples an output of a current sensor connected to the circuit and includes a memory storing data of current values regarded as representing overcurrents in consideration of the respective durations thereof. The current values are stored in pairs with time values representing the durations. The sampled value is compared with the current values stored in the memory while duration of the sampled value is compared with the time value paired with that current value.

9 Claims, 3 Drawing Sheets

OVERCURRENT DETECTING METHOD AND APPARATUS

BACKGROUND OF THE INVENTION

1. Field of the Invention

The present invention relates generally to a method of detecting occurrence of an overcurrent state in an electric circuit, and more particularly to an overcurrent detecting method and apparatus which are capable of determining the occurrence of an overcurrent in an electric circuit with high accuracy and reliability on the basis of sample values derived by periodically sampling an output signal of a current sensor installed in the circuit to be monitored.

2. Description of the Prior Art

Generally, in circuits such as, for example, a travel control circuit and a cargo handling circuit for a battery-powered fork lift truck, a fuse is inserted between a battery and electromechanical components such as motors and circuit elements such as power transistors and others connected together in the form of an electric circuit so that upon occurrence of an overcurrent in the circuit, the fuse is melted and breaks to thereby protect the electromechanical components as well as the electronic elements mentioned above against the overcurrent. In this conjunction, it is also known to protect electric and electronic circuit components from overcurrents with high accuracy by using a current sensor comprising a Hall element or the like and determining the occurrence of an overcurrent through comparison of sample values of the output signal of the current sensor with a preset reference current value, wherein a controllable element such as an electromagnetic contactor is automatically controlled on the basis of the result of the decision to thereby ensure that the electric motor, power transistor and others can operate within a safe operating range.

In overcurrent detecting methods known heretofore, such measures as shown in FIG. 5 have generally been adopted wherein the output current of a current sensor is periodically monitored to determine occurrence of an overcurrent state when the output current having a magnitude greater than a predetermined reference value Io continues to flow over a period exceeding a predetermined time. More specifically, referring to FIG. 5, the period or time interval T for sampling the output signal of a current sensor is so set that the period falls within a permissible duration TA of a current greater than the preset reference value Io, and the overcurrent is detected by periodically sampling the output of the current sensor at the time interval T.

With the above overcurrent detecting method, it is however impossible to detect a current Io' which is slightly smaller than the preset reference value Io and may nevertheless adversely affect the circuit components when it continues to flow over an extended time period.

This problem can certainly be solved by lowering the reference level Io to the current value Io'. However, there may occur such undesirable situations as the anti-overcurrent protective operation being performed even when the current Io' continues to flow for a period which does not adversely affect the associated circuit. As a result, performance of a machine equipped with this circuit is degraded correspondingly due to undesirable frequent activation of the overcurrent protection operation.

Under these circumstances, there exists a demand for an overcurrent detecting method and apparatus which are capable of detecting with high reliability and accuracy only such electric current which adversely affects the circuit as well as associated machine.

SUMMARY OF THE INVENTION

According to one aspect of the present invention, there is provided a method of detecting occurrence of an overcurrent in an electric circuit, in which an overcurrent detecting memory having an area defined along a time axis and a current axis is utilized for storing in the area sets of data representing combinations or pairs of current values regarded as indicating overcurrents in view of durations thereof and time values representing the durations. An output of a current sensor adapted for detecting the current flowing through the electric circuit is periodically sampled at a time interval shorter than the duration represented by the time value associated with a maximum one of the current values stored in the memory area, and the sampled values of the sensor output are successively compared with the current values stored in the memory in descending order, starting from the maximum current value. The time value paired with the maximum one of the current values which are smaller than the sampled value is read out from the memory, wherein the time value read out from the memory is compared with a sum of periods over which the sampled value remains to be substantially constant, to thereby decide that the sampled value represents an overcurrent state, when the sum of the periods is equal to or greater than the duration represented by the above-mentioned time value.

According to another aspect of the present invention, there is also provided an overcurrent detecting apparatus for carrying out the above-mentioned method.

According to the teachings of the present invention, a group of current value data combined with the time values in such a relation that the current value decreases progressively and stepwise as the time value increases are stored in a memory area, wherein the sample values derived periodically from the current sensor output is compared with the current values in descending order starting from the maximum current value. The time interval at which the current sensor output is periodically sampled is so selected that it is shorter than the duration represented by the time value combined with the maximum one of the current values stored in the memory. A maximum one of those current values which are smaller than the sampled value is picked up, and the time value combined with the picked-up current value is compared with a sum of periods during which the above-mentioned sampled value has continued to be detected. In general, the periods during which the sampled value is detected represent the time for which the current corresponding to the sampled value continues to flow. Accordingly, it can be determined that the current corresponding to the sampled value represents an overcurrent, when the duration of the sampled value as given by the sum of the periods during which the sampled value is detected is longer than the time value which is combined with the picked-up current value in such relation that the combination falls within the overcurrent detection area defined in the memory.

BRIEF DESCRIPTION OF THE DRAWINGS

The invention will become more readily apparent from the following description of a preferred embodiment thereof shown, by way of example only, in the accompanying drawings, wherein.

DESCRIPTION OF THE PREFERRED EMBODIMENT

Now, the present invention will be described by reference to the drawings, particularly to FIG. 1, wherein a block diagram is illustrated to show an overcurrent detecting apparatus according to an embodiment of the invention incorporated in cargo handling/travel control circuit of a battery-powered fork lift truck.

Figure 1:
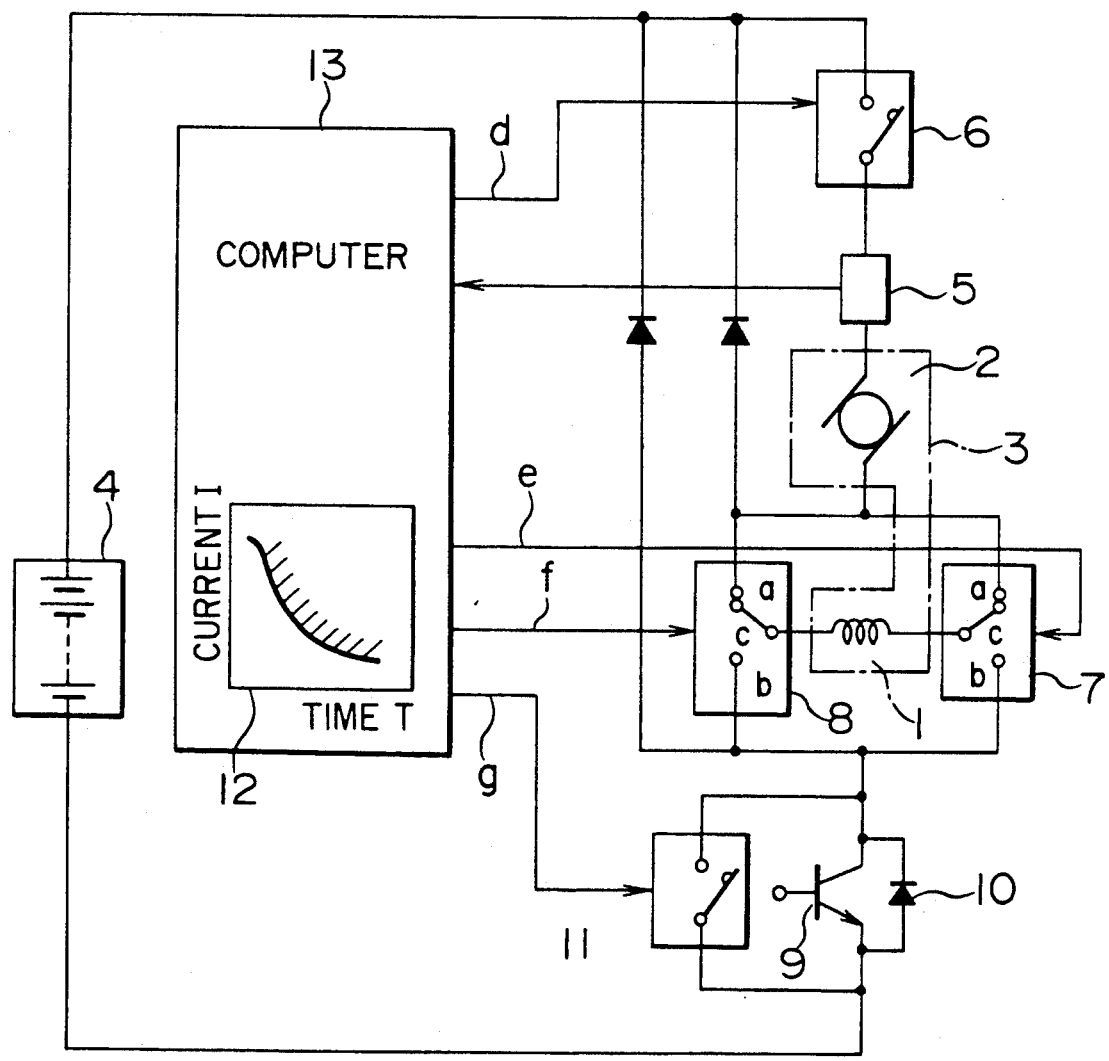
FIG. 1 is a block diagram showing a circuit configuration of an overcurrent detecting apparatus according to an embodiment of the present invention.

As shown in FIG. 1, the cargo handling/travel control circuit of the fork lift truck is designed to drive an electric motor 3 comprising a field coil 1 and an armature coil 2 by supplying thereto electric power from a battery 4. More specifically, the armature coil 2 has one end connected to positive electrodes of the battery 4 through a serial connection of a current sensor 5 and a regenerating contactor 6, while the other end of the armature coil 2 is connected to first contact terminals a of a forward contactor 7 and a reverse contactor 8, respectively. The forward and reverse contactors 7 and 8 have respective common terminals c between which the field coil 1 is connected, while second contact terminals b of the forward and reverse contactors 7 and 8, respectively, are connected in common to a collector electrode of a main transistor 9. A reverse conducting diode 10 is connected between collector and emitter electrodes of the main transistor 9 to which there is further connected in parallel a protecting contactor 11. The emitter electrode of the main transistor 9 is connected to a negative polarity electrode of the battery 4.

Figure 5:
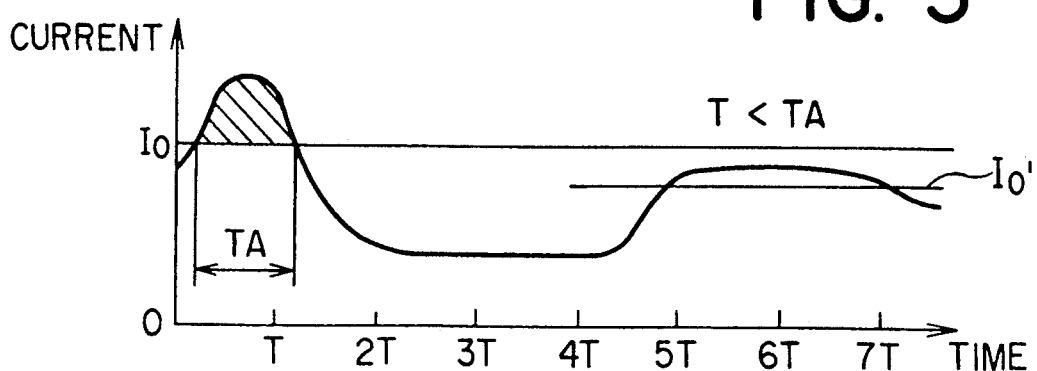
FIG. 5 is a waveform diagram for illustrating the principle of an overcurrent detecting apparatus known heretofore.

The above-mentioned regenerating contactor 6, forward contactor 7, reverse contactor 8 and protecting contactor 11 are adapted to be controlled by various control signals d, e, f and g supplied from a microcomputer 13 (CPU) which incorporates an overcurrent or overcurrent state detection memory 12 provided according to the invention. These control signals d, e, f and g are generated whenever occurrence of an overcurrent or overcurrent state as mentioned in conjunction with FIG. 5 (hereinafter merely referred to as "overcurrent") is determined by the CPU 13 on the basis of the detection signal output from the current sensor 5 by referring to the overcurrent detection memory 12, whereby the individual contactors 6, 7, 8 and 11 are correspondingly controlled by the control signals d, e, f and g, respectively, so as to limit the currents flowing through the electric motor 3 and the main transistor 9 within respective rated safety current ranges.

Figure 2:
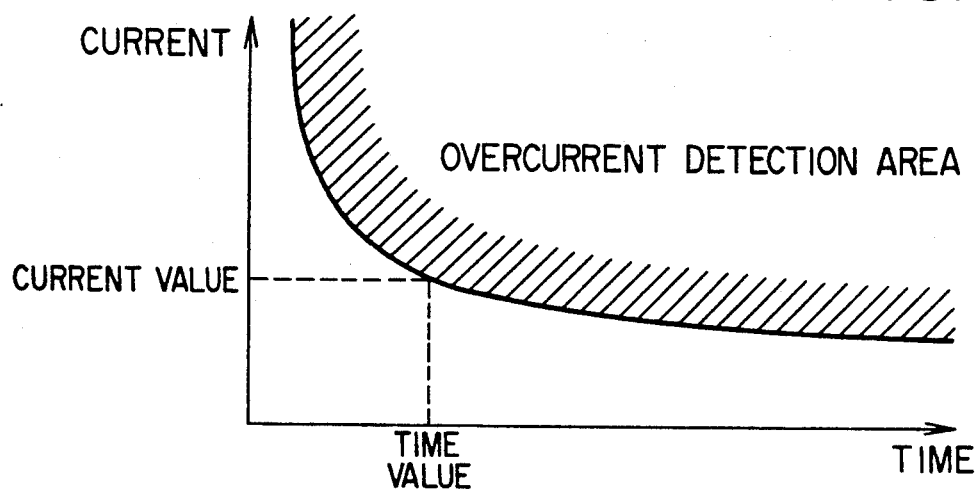
FIG. 2 is a view for graphically illustrating the contents of an overcurrent detecting memory used in the apparatus shown in FIG. 1.

FIG. 2 is a view graphically illustrating contents of data stored in the overcurrent detection memory 12. As will be understood from FIG. 2, there are previously stored in an area defined along a time axis and a current axis a group of data representing values of currents which can be regarded as overcurrents in view of the times or temporal durations for which the currents continue to flow. The stored data show that the overcurrent assumes a value which decreases stepwise progressively as time increases. A hatched region above a hyperbolic curve obtained by interconnecting plotted sets of the time values and the current values is defined as an overcurrent detection region. In this conjunction, it should be noted that the time or temporal duration combined with a maximum one of the current values as stored delimits a period for sampling the detection signal from the current sensor 5 and is set to be equal to or greater than the sampling period.

Next, description will be made to a method of detecting the overcurrent by using the overcurrent detecting memory 12 with reference to FIGS. 3 and 4.

Figure 4:
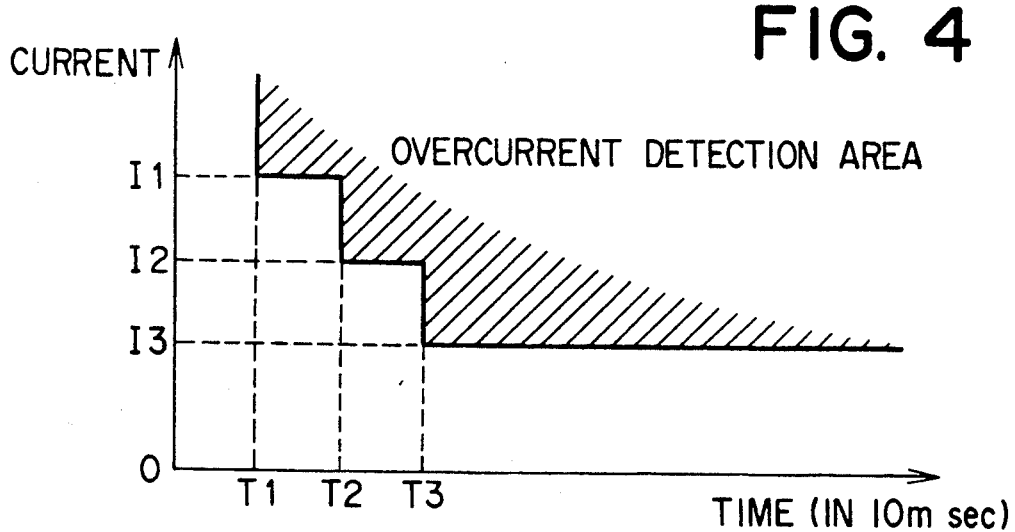
FIG. 4 is a view for illustrating a concrete example of the contents of the memory shown in FIG. 2.

FIG. 4 is a view graphically illustrating an example of the contents of the memory 12 shown in FIG. 2 in which three current values $I_1$, $I_2$ and $I_3$ determined as representing the overcurrents are stored in relation to (or in combination with) three time values $T_1$, $T_2$ and $T_3$, respectively.

Sample values of the detection current output from the current sensor 5 are periodically supplied to the CPU 13 from the current sensor 5 by activating a current fetch subroutine not shown. More specifically, the CPU 13 fetches the detection current signal output from the current sensor 5 twice in each main routine cycle and uses as the sample value a mean value Iav of the detection currents sampled twice every main routine cycle. Accordingly, the sample current value Iav has a duration which coincides with the period of the main routine. The sample current value Iav then undergoes an overcurrent detecting subroutine processing shown in FIG. 3 to make a decision whether the sample current value Iav represents an overcurrent or not.

Figure 3:
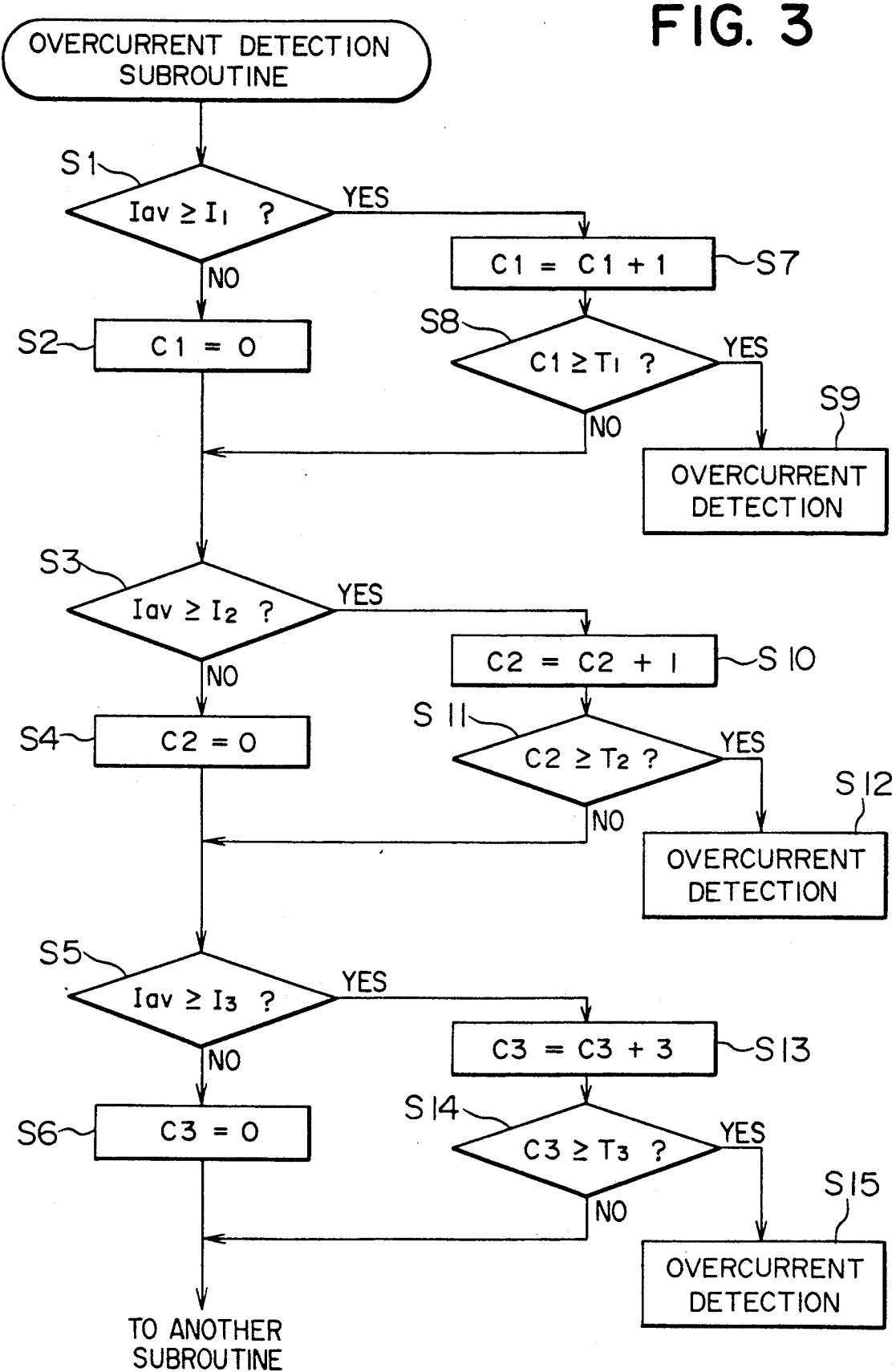
FIG. 3 is a flow chart for illustrating operation of the overcurrent detecting apparatus shown in FIG. 1.

Referring to FIG. 3, the overcurrent detecting subroutine inludes a group of current value comparison steps S1 to S6 and a group of time value comparison steps S7 to S9; S10 to S12 and S13 to S15. When the sample current value Iav is fetched, it is compared in step S1 with the current values $I_1$, $I_2$ and $I_3$ shown in FIG. 3 successively in descending order thereof. Since it is assumed that $I_1 > I_2 > I_3$, the sample current value Iav is first compared with the current value $I_1$. When it is decided that the sample current value Iav is smaller than $I_1$ (i.e. when Iav $< I_1$), then the processing proceeds to step S2 where a counter C1 incorporated in the CPU and hereinafter described is set to "0" (zero), which is then followed by execution of the step S3. The reason why step 7 of the time value comparison branch is not executed when Iav $< I_1$ can be explained by the fact that the comparison of the sample value Iav with the time value $T_1$ paired with the current value $I_1$ can never lead to detection of any overcurrent state so long as the sample current value Iav remains smaller than the reference current value $I_1$.

In step S3, the sample current value Iav is then compared with the reference current value $I_2$. If it is determined that Iav $< I_2$, the succeeding step S4 is executed to reset an internal counter C2 to "0" (zero), whereupon the processing of this subroutine proceeds to step S5. At this time, step S10 is not executed even when Iav $< I_2$ for the same reason as described above in conjunction with the step S1.

Similarly when it is decided in step S5 that $Iav < I_3$, the succeeding step S6 is executed to set an internal counter C3 to "0", whereupon another subroutine is activated without executing step S13. In this manner, only the current comparison steps S1, S3 and S5 are executed so long as the sample current value Iav remains smaller than any one of the reference current values $I_1$, $I_2$ and $I_3$. This means that the cargo handling/travel control circuit shown in FIG. 1 is in the normal operation state in which no overcurrent takes place.

Now, assuming that it is determined in step S1 that the sampled sensor current value Iav is equal to or greater than the reference current value $I_1$ (i.e. $Iav \geq I_1$), the processing proceeds to step S7 in the time value comparison branch. In step S7, the value of the internal counter C1 is incremented by one (unity). It should be noted that the internal counters C1, C2 and C3 in each time value comparison branch serve to set the temporal durations of the sample current value Iav which correspond to the number of times the current value Iav satisfies the conditions that $Iav \geq I_1$, $Iav \geq I_2$ and $Iav \geq I_3$ in steps S1, S3 and S5, respectively. For example, if the determination that $Iav \geq I_1$ now made in step S1 is the third time, the internal counter C1 is set to a count value corresponding to, for example, "30 msec", indicating that the sample current value Iav equal to or greater than the reference value $I_1$ has been detected over a duration of 30 msec in total. As a result of this, the CPU 13 recognizes that a current not smaller than the reference value $I_1$ has continued to flow through the circuit shown in FIG. 1 over a duration corresponding to three routine cycles.

Then, in the succeeding step S8, the value of the internal counter C1 is compared with the time value (reference temporal duration) $T_1$ which is combined or paired with the reference current value $I_1$. When it is determined that the content of the counter $C_1$ is shorter than $T_1$, i.e. when $C_1 < T_1$, it is regarded that the detected current corresponding to the sample current value Iav can exert no adverse effect on the components of the circuit shown in FIG. 1 in view of the temporal duration of that current. Accordingly, the processing proceeds to step S3. On the other hand, when it is found in step S8 that $C_1 \geq T_1$, it is then determined that the detected current corresponding to the sample sensor current value Iav fetched at this time point is a problem in relation to the temporal duration $T_1$, resulting in that the CPU 13 detects an overcurrent state (step S9). When the sampling period is set equal to the temporal duration corresponding to the reference current $I_1$ associated with the reference current value $T_1$, the overcurrent state can be detected, even when it is only determined once that $Iav \geq I_1$.

Similarly, through the process including the steps S10 and S11 and branched from step S3, a determination as to occurrence of an overcurrent state is made on the basis of the sample current value Iav in the range of $I_1 > Iav \geq I_2$ while taking into account the relation to the time value (temporal duration) $T_2$. When the overcurrent state is detected, the processing proceeds to step S12 and otherwise to step S5. Additionally, through the processing including the steps S13 and S14 and branched from step S5, determination as to an overcurrent is made on the basis of the sample current Iav which is in the range of $I_2 > Iav \geq I_3$ by taking into consideration the relation to the time value $T_3$. When an overcurrent state is detected, the processing proceeds to step S15 and otherwise to another subroutine.

Thus, as will be understood from the above description, according to the teachings of the invention, even a current of a magnitude slightly smaller than a reference value, but which continues to flow over a duration longer than a predetermined critical time, can be detected as an indication of an overcurrent state.

Further, by increasing the number of sets of data representing combinations of current values and time values stored for reference in the overcurrent detection memory, it is possible to detect overcurrent states over an extended range with higher accuracy and reliability.

As will now be appreciated from the foregoing description, the problems described hereinbefore in conjunction with the prior art overcurrent detection system which is designed to periodically monitor the output of the current sensor can satisfactorily be solved according to the teachings of the invention, whereby it is possible to detect with enhanced accuracy the overcurrent states on the basis of combinations of various current values and corresponding permissible current flow durations.

While the invention has been described in terms of its preferred embodiment, it should be understood that numerous modifications may be made thereto without departing from the spirit and scope of the invention as defined in the appended claims. It is intended that all such modifications fall within the scope of the invention.

I claim:

1. A method of detecting occurrence of an overcurrent state in an electric circuit, comprising the steps of:
   providing an overcurrent detection memory having an area therein capable of being defined along a time axis and a current axis, said area storing sets of data representing combinations of current values regarded as indicating overcurrent states in view of durations thereof and time values representing said durations;
   periodically sampling an output of a current sensor adapted to detect the current flowing through said electric circuit at a selected time interval shorter than the duration represented by the time value paired with the maximum one of said current values stored in said memory area;
   comparing the sampled value of said sensor output sequentially with said current values stored in said memory in descending order of magnitude, starting from the maximum one of said current values;
   reading out from said memory the time value paired with the maximum one of the current values which are smaller than said sampled value; and
   comparing the time value read out from said memory with the sum of said selected time intervals during which said sampled value has remained substantially constant, to thereby determine that said sampled value represents an overcurrent state, when said sum of said selected time intervals is equal to or greater than the duration represented by said read out time value.

2. An overcurrent detecting method according to claim 1, wherein said steps are executed by a microcomputer including therein said memory.

3. An overcurrent detecting method according to claim 2, wherein said sampled value is a mean value derived by averaging a plurality of current values derived from said current sensor.

4. An overcurrent detecting method according to claim 3, wherein said microcomputer includes an internal counter to indicate the total time during which said sampled value continues to be substantially constant by counting the number of times said mean value remains equal to or greater than said current value stored in said memory.

5. An overcurrent detecting method according to claim 4, wherein the value of the count in said internal counter is compared with the time value paired with said current value, and wherein when the value of the count in said internal counter is smaller than said time value, determination is made that said sampled value in relation to said time value does not represent an overcurrent adversely affecting said electric circuit and otherwise, determination is made that said sampled value represents an overcurrent adversely affecting said electric circuit.

6. An apparatus for detecting occurrence of an overcurrent state in an electric circuit, comprising:

an overcurrent detection memory having an area therein capable of being defined along a time axis and a current axis, said area storing sets of data representing combinations of current values regarded as indicating overcurrents in view of durations thereof and time values representing said durations;

means for sampling an output of a current sensor adapted to periodically detect the current flowing through said electric circuit at a selected time interval shorter than the duration represented by the time value paired with the maximum one of said current values stored in said memory area;

means for comparing the sampled value of said sensor output sequentially with said current values stored in said memory in descending order of magnitude, starting from the maximum one of said current values;

means for reading out from said memory the time value paired with the maximum one of said current values which are smaller than said sampled value; and means for comparing the time value read out from said memory with the sum of said selected time intervals during which said sampled value has remained substantially constant, thereby determining that said sampled value represents an overcurrent state, when said sum of said selected time intervals is equal to or greater than the duration represented by said read out time value.

7. An overcurrent detecting apparatus according to claim 6, further including means for averaging a plurality of current values outputted from said current sensor to thereby generate a means value of said plurality of current values as said sampled value.

8. An overcurrent detecting apparatus according to claim 7, further including a counter which indicates the total time during which said sampled value continues to be substantially constant.

9. An overcurrent detecting apparatus according to claim 8, wherein the value of the count in said counter is compared with the time value paired with said current value, and wherein when the value of the count in said counter is smaller than said time value, determination is made that said sampled value in relation to said time value does not represent an overcurrent adversely affecting said electric circuit and, otherwise, determination is made that said sampled value represents an overcurrent which adversely affects said electric circuit.

* * * * *